US010729034B2

(12) United States Patent
Zaindl et al.

(10) Patent No.: US 10,729,034 B2
(45) Date of Patent: Jul. 28, 2020

(54) COOLING DEVICE FOR ELECTRONIC CONTROL UNIT

(71) Applicant: MAN Truck & Bus AG, München (DE)

(72) Inventors: Albert Zaindl, Gerolsbach (DE); Christian Brand, Schiltberg (DE); Philipp Pelzer, Weilheim (DE); Lenz Thoma, München (DE)

(73) Assignee: MAN TRUCK & BUS AG, Munich (DE)

( * ) Notice: Subject to any disclaimer, the term of this patent is extended or adjusted under 35 U.S.C. 154(b) by 0 days.

(21) Appl. No.: 15/919,961

(22) Filed: Mar. 13, 2018

(65) Prior Publication Data

US 2018/0270986 A1   Sep. 20, 2018

(30) Foreign Application Priority Data

Mar. 17, 2017 (DE) .................. 10 2017 002 601

(51) Int. Cl.
*H05K 7/20* (2006.01)
*B60R 16/023* (2006.01)
(Continued)

(52) U.S. Cl.
CPC ..... *H05K 7/20145* (2013.01); *B60R 16/0231* (2013.01); *B60R 16/0239* (2013.01);
(Continued)

(58) Field of Classification Search
CPC .......... H05K 7/20145; H05K 7/20863; H05K 7/20209; H05K 5/0017; H05K 7/20154;
(Continued)

(56) References Cited

U.S. PATENT DOCUMENTS 3,004,196 A    10/1961  Drexel
7,564,685 B2 * 7/2009  Clidaras .................. G06F 1/206
                                                   165/80.4
(Continued)

FOREIGN PATENT DOCUMENTS

DE    3151301 A1    7/1983
DE    3036098 C2   12/1983
(Continued)

OTHER PUBLICATIONS

Vogl, Thomas, "Temperature critical components cooling device e.g., for electronic components, uses hollow plate or module for specifically supplying a coolant", Aug. 14, 2002, Siemens AG, Entire Document (Translation for DE10102869, Original Copy Already Provided). (Year: 2002).*

*Primary Examiner* — Jayprakash N Gandhi
*Assistant Examiner* — Stephen S Sul
(74) *Attorney, Agent, or Firm* — Weber Rosselli & Cannon LLP

(57) ABSTRACT

The present disclosure relates to an electronic control unit for a motor vehicle, having a first electronic control device, in particular a first equipped circuit board. The electronic control unit additionally has a gas cooling duct for conducting a compressed gas. The gas cooling duct is connected in a thermally conductive fashion to the first electronic control device, and is designed to separate the compressed gas from the first electronic control device. The gas cooling duct has an expansion section in which a flow cross section of the gas cooling duct widens in order to expand and cool the compressed gas in order to cool the first electronic control device.

19 Claims, 2 Drawing Sheets

(51) Int. Cl.
  *F25B 9/00* (2006.01)
  *F25B 9/06* (2006.01)
  *H05K 5/00* (2006.01)

(52) U.S. Cl.
  CPC ............. *F25B 9/004* (2013.01); *F25B 9/06* (2013.01); *H05K 5/0017* (2013.01); *H05K 7/20154* (2013.01); *H05K 7/20209* (2013.01); *H05K 7/20863* (2013.01)

(58) Field of Classification Search
  CPC . B60R 16/0239; B60R 16/0231; F25B 9/004; F25B 9/06; H01L 23/445
  USPC .............................. 361/690, 691, 721
  See application file for complete search history.

(56) References Cited

U.S. PATENT DOCUMENTS

| | | | | |
|---|---|---|---|---|
| 8,867,210 | B2* | 10/2014 | Harmelink | H05K 7/20254 165/104.33 |
| 2002/0100577 | A1* | 8/2002 | Wagner | H01L 23/467 165/80.3 |
| 2006/0232942 | A1* | 10/2006 | Nakatsu | H01L 23/4093 361/710 |
| 2007/0223199 | A1* | 9/2007 | Fujiya | H05K 7/20736 361/721 |
| 2008/0192445 | A1 | 8/2008 | Meyer | |
| 2008/0266797 | A1* | 10/2008 | Tseng | G06F 1/20 361/697 |
| 2010/0008025 | A1* | 1/2010 | Nemoz | H05K 7/20563 361/678 |
| 2010/0073883 | A1* | 3/2010 | Miyamato | C23C 24/04 361/709 |
| 2010/0110634 | A1* | 5/2010 | Woodbury, II | B62B 5/0026 361/698 |
| 2013/0091867 | A1* | 4/2013 | Campbell | H05K 7/20809 62/3.2 |
| 2015/0053390 | A1* | 2/2015 | Banks | F04C 29/02 165/287 |
| 2015/0208555 | A1* | 7/2015 | Flotta | H01L 23/4735 361/679.47 |

FOREIGN PATENT DOCUMENTS

| | | |
|---|---|---|
| DE | 19517491 A1 | 11/1996 |
| DE | 10102869 A1 | 8/2002 |
| DE | 202005009039 U1 | 10/2006 |
| DE | 102012001119 A1 | 7/2013 |
| DE | 202014104445 U1 | 9/2014 |

* cited by examiner

COOLING DEVICE FOR ELECTRONIC CONTROL UNIT

BACKGROUND

The present disclosure relates to an electronic control unit, to a motor vehicle having an electronic control unit and to a method for cooling an electronic control unit.

Power components such as, for example, graphic processors, of electronic control units can become very hot during operation. In addition, electronic control units in a motor vehicle can to a certain extent be subjected to very high temperatures if they are arranged, for example, close to a gearbox or an internal combustion engine. In order to prevent failure of the electronic control unit owing to overheating and to lengthen a service life, the control unit can be cooled.

The cooling can be carried out, for example, passively by means of convection or assisted by means of fans. In order to output heat to the surroundings, control units must have large surfaces. Heat can be output here only to a small extent as a function of the ambient temperature. In addition, ram air which forms can further reduce the output of heat.

DE 195 17 491 A1 discloses a cooling system for a gearbox control apparatus of a motor vehicle. An electronic control device of the control apparatus is forcibly cooled by targeted feeding of a control fluid to the electronic control device or through the electronic a control device. The control fluid can be driven by feed means through a cooling plate on which the electronic control device is arranged with optimum thermal conductivity. The control fluid can be air or hydraulic oil.

DE 20 2005 009 039 U1 discloses an electronic control unit for a motor vehicle, in particular for a gearbox controller. The electronic control unit has a printed circuit board which is arranged in a housing and carries electronic components. An electronic heat protection barrier is arranged between the printed circuit board and the housing. Compressed air can be conducted in a meandering cooling coil of a cooling element of the electronic control unit.

SUMMARY

The present disclosure is directed to providing improved cooling for an electronic control unit.

The electronic control unit has a first electronic control device, in particular a first equipped circuit board. The electronic control unit has a gas cooling duct for conducting a compressed gas. The gas cooling duct is connected in a thermally conductive fashion to the first electronic control device and is designed to separate the compressed gas from the first electronic control device. The gas cooling duct has an expansion section. In the expansion section, a flow cross section of the gas cooling duct widens in order to expand and cool the compressed gas in order to cool the first electronic control device.

The first electronic control device can therefore be selectively cooled by the gas which cools during the expansion. The cooling does not require any components which are susceptible to wear, such as, for example, fans. The separation of the compressed gas from the first electronic control device can prevent impurities in the compressed gas, for example oil droplets or particles of dust, from coming into contact with the electronic control device.

The expansion section can widen a flow cross section of the gas cooling duct continuously and/or in a step-shaped fashion.

The expansion section increases the flow cross section of the gas cooling duct. An area of a flow cross section downstream of the expansion section can be, for example, larger than 1.5 times an area of a flow cross section upstream of the expansion section. The enlargement of the flow cross section can have, for example, a factor in a range between 1.5 and 20.

In one embodiment, the electronic control unit also has a second electronic control device, in particular a second equipped circuit board. The gas cooling duct is arranged, in particular, between the first electronic control device and the second electronic control device. This has the advantage that cooling can take place through the gas cooling duct on two sides.

In a further embodiment the electronic control unit also has a housing, and the first electronic control device, the second electronic control device and/or the gas cooling duct are/is arranged in the housing. Alternatively or additionally, the gas cooling duct is integrated into a cooling plate or cooling coil which is mounted together with the first electronic control device, the second electronic control device and/or a housing of the electronic control unit (e.g. said components are attached or fitted to one another). The first electronic control device and/or the second electronic control device can be arranged in the housing.

In still a further embodiment, the first electronic control device and/or the second electronic control device have/has a power component. The power component can be, in particular, a processor, a graphic processor, a network interface, a microcontroller and/or a memory unit. The power component is connected in a thermally conductive fashion to the gas cooling duct, in particular the expansion section and/or a section downstream of the expansion section. Consequently, a power component can be cooled selectively.

In yet another embodiment, the gas cooling duct is fitted onto the first electronic control device, and/or the second electronic control device is fitted onto the gas cooling duct. This permits a compact sandwich design of the electronic control unit.

In one embodiment, the first electronic control device or the second electronic control device has a printed circuit board. The printed circuit board is equipped with the power component on a side which faces the gas cooling duct. In other words, an equipment side of the printed circuit board faces the gas cooling duct. The power component therefore projects in a direction of the gas cooling duct. As a result, the distance between the power component and the gas cooling duct can be reduced.

The printed circuit board can be capable of being equipped, for example, on one side or on two sides.

In a further embodiment, an inlet of the gas cooling duct and an outlet of the gas cooling duct are arranged on the same side of the housing. Alternatively or additionally, the gas cooling duct has at least one diversion through 180°. This permits a long gas cooling duct, as a result of which the cooling performance can be increased.

The gas cooling duct may be designed to conduct compressed air. Alternatively or additionally, the gas cooling duct is or can be connected to a pressure tank, in particular a compressed air tank. The use of compressed air can be advantageous, in particular, when a compressed air system is already present. This can be the case, for example, in utility vehicles.

In yet a further embodiment, the electronic control unit also has a heat sink. The heat sink is arranged in the gas cooling duct, in particular in the expansion section and/or a section downstream of the expansion section. The heat sink is connected in a thermally conductive fashion to the first electronic control device and/or the second electronic control device. This has the advantage that the heat sink can improve conduction of heat between the cooled gas and the electronic control device. The heat sink can additionally have a large surface. The transfer of heat between the cooled gas and the heat sink can therefore be increased.

In a further embodiment, the heat sink is connected in a thermally conductive fashion to the power component of the first electronic control device and/or of the second electronic control device. Alternatively or additionally, the heat sink has a multiplicity of cooling fins which are oriented, in particular, in a direction of flow in the gas cooling duct. The provision of cooling fins can enlarge the surface of the heat sink.

In a further embodiment variant, a multiplicity of heat sinks are provided for the first electronic control device and/or for the second electronic control device, in particular for multiplicity of power components of the first electronic control device and/or of the second electronic control device. This has the advantage that a plurality of electronic components can be selectively cooled.

A heat sink can be connected in a thermally conductive fashion to a plurality of power components. For example, a heat sink can be connected in a thermally conductive fashion to a power component of the first electronic control device and to a power component of the second electronic control device. The heat sink can be arranged, for example, between the two power components.

It is also possible that a separate heat sink is provided for each power component which requires selected cooling.

In one embodiment, the gas cooling duct has a multiplicity of expansion sections, which are each connected, in particular, in a thermally conductive fashion to one or more power components of the first electronic control device or of the second electronic control device. The expansion sections can be arranged in series or in parallel.

In one embodiment, the electronic control unit also has a gas valve. The gas valve is arranged in the gas cooling duct, in particular upstream of the expansion section or upstream of the gas cooling duct for setting a flow rate of the compressed gas. This allows controlling of a supply of the compressed gas and therefore controlling of the cooling performance.

The gas valve can be a switching valve or a continuous valve. The switching valve can permit discrete switching between open and closed. The continuous valve can permit a continuous transition between the switched positions, as a result of which a volume flow of the compressed gas can be set.

In a further embodiment, the electronic control unit also has a temperature sensor for measuring a temperature of the power component, of the first electronic control device, of the second electronic control device and/or of the electronic control unit. The gas valve can additionally be controlled on the basis of a temperature which is measured by the temperature sensor. This permits the temperature of the electronic control unit to be controlled. In addition, the electronic control unit can be kept in a desired temperature range by corresponding control of the gas valve.

The present disclosure also relates to a motor vehicle, in particular a utility vehicle, having a pressure tank, preferably a compressed air tank, and an electronic control unit as disclosed herein. The gas cooling duct of the electronic control unit is connected to the pressure tank. The motor vehicle can also have, in particular, a motor and a compressor. The compressor can be driven by the motor and connected to the pressure tank. The pressure tank and the compressor can be, in particular parts of an existing, compressed air system of the motor vehicle which is already provided for other applications.

The present disclosure also relates to a method for cooling an electronic control unit, in particular in a motor vehicle. The method comprises conducting a compressed gas, in particular compressed air, through a gas cooling duct. The gas cooling duct separates the compressed gas from an electronic control device of the electronic control unit and is connected in a thermally conductive fashion to the electronic control device. The method also comprises expanding the compressed gas in the gas cooling duct. The method also comprises cooling the gas by means of the expansion and cooling the electronic control device, in particular a power component of the electronic control device, by cooling the gas.

Of course, the expansion of the compressed gas takes place in a fashion which is defined (controlled) in accordance with a predefined widening of the flow cross section.

As in the electronic control unit disclosed herein, the method permits the selected cooling of the electronic control device by the gas which cools during the expansion. The selected expansion of the compressed gas in the housing permits the selected cooling of the electronic control device. The cooling does not require any components which are susceptible to wear, such as for example fans.

In one embodiment, the method also comprises compressing the gas and cooling the compressed gas in a pressure tank, in particular a compressed air tank, of the motor vehicle. The cooled compressed gas can then be used to cool the electronic control unit. The cooling can be carried out without further expenditure through the influence of the ambient temperature on the pressure tank.

The preferred embodiments and features of the present disclosure which have been described above can be combined with one another as desired.

BRIEF DESCRIPTION OF THE FIGURES

Further details and advantages of the present disclosure are described below with reference to the appended drawings, in which.

The embodiments shown in the figures correspond at least partially, with the result that similar or identical parts are provided with the same reference symbols, and for the explanation thereof reference is also made to the description of the other embodiments or figures in order to avoid repetitions.

DETAILED DESCRIPTION

Figure 1:
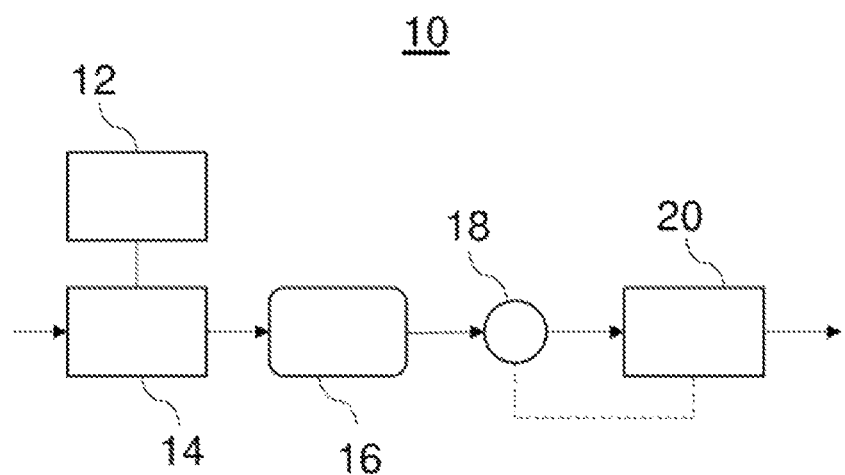
FIG. 1 shows an exemplary arrangement with a control unit.

FIG. 1 illustrates an arrangement 10. The arrangement 10 has a motor 12, a compressor 14, a pressure tank 16, a gas valve 18 and an electronic control unit 20. The arrangement 10 can be provided, for example, in a motor vehicle, in particular a utility vehicle, for example a truck or a bus.

An embodiment in which compressed air is used as the compressed gas for cooling the control unit is given below. Other embodiments can use other compressed gases.

The motor 12 drives the compressor 14 to compress ambient air. The motor 12 can be an electric motor or an internal combustion engine. The ambient air heats up during the compression. The compressed air is buffered in the pressure tank 16, for example at a pressure of 8 bar. The compressed air cools in the pressure tank 16. The compressed air in the pressure tank 16 can be used for various applications.

The compressed air from the pressure tank 16 can be directed to the electronic control unit 20 via the gas valve 18. The electronic control unit 20 can actuate the gas valve 18 to open or close. In some embodiments, the gas valve 18 can be a controllable gas valve which can be adjusted in an infinitely variable fashion between an open position and a closed position. The gas valve 18 permits a flow rate of compressed air from the pressure tank 16 to the electronic control unit 20 to be set.

The gas valve 18 can be arranged in a gas cooling duct of the electronic control unit 20, in particular upstream of an expansion section of the gas cooling duct, or upstream of the gas cooling duct.

Figure 2:
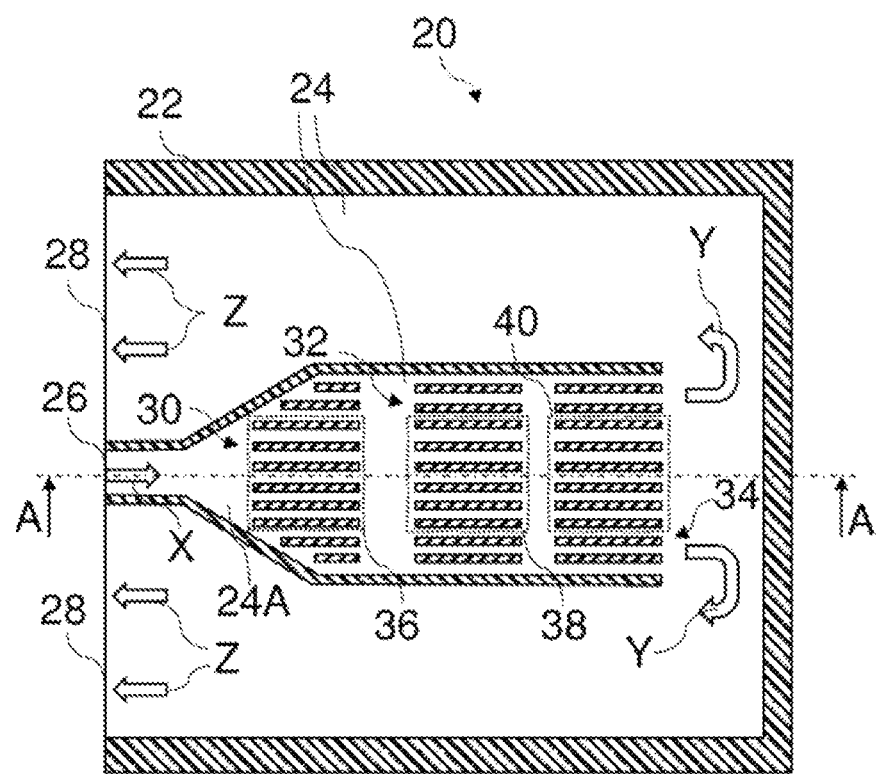
FIG. 2 shows a schematic sectional illustration through an exemplary control unit along the line B-B in FIG. 3.
Figure 3:
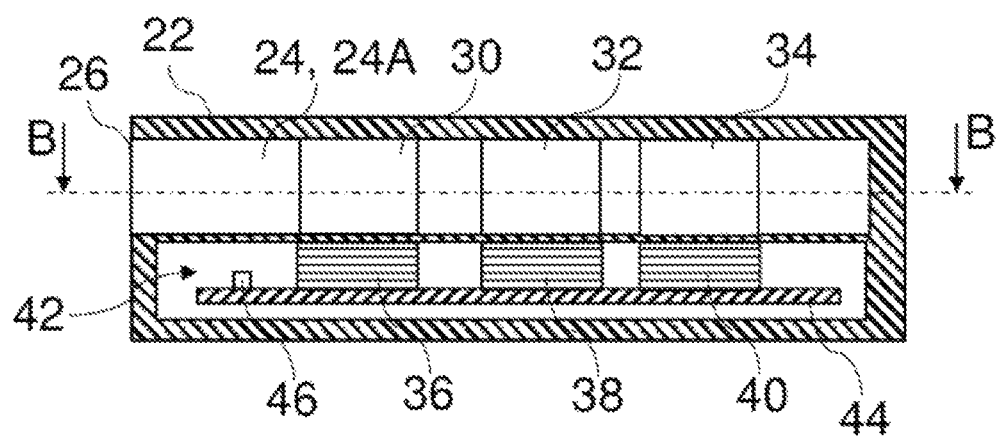
FIG. 3 shows another schematic sectional illustration through the exemplary control unit along the line A-A in FIG. 2.

FIG. 2 shows a section through a gas cooling duct of the control unit 20 according to the line B-B in FIG. 3.

The control unit 20 has a housing 22. A gas cooling duct 24 which is embodied as a compressed air duct is arranged in the housing 22. The gas cooling duct 24 is connected to the pressure tank 16 via the gas valve 18 (see FIG. 1). The gas cooling duct 24 extends between an inlet 26 on the housing 22 and an outlet 28 on the housing 22. When the gas valve 18 is opened (see FIG. 1), compressed air flows through the inlet 26 into the gas cooling duct 24, as characterized by an arrow X. The compressed air flows through an expansion section 24A of the gas cooling duct 24. Finally, the compressed air in the gas cooling duct is diverted through approximately 180°, as illustrated by arrows Y. Finally, the compressed air exits the housing 22 through the outlet 28, as illustrated by arrows Z. The compressed air can be output into the surroundings from the outlet 28, for example. The inlet 26 and the outlet 28 are arranged on the same side of the housing 22. Of course, depending on the requirements it is also possible to use other ways of conducting the flow for the gas cooling duct.

In the expansion section 24A, a flow cross-sectional area of the gas cooling duct 24 becomes larger. The pressure of the compressed air is reduced when it flows through the expansion section 24A. This brings about cooling of the expanding compressed air in the expansion section 24A. The cooling and cooled compressed air flows through a plurality of heat sinks 30, 32 and 34, which each have a multiplicity of cooling fins. The heat sink 30 projects partially into the expansion section 24A. The heat sinks 32 and 34 are arranged downstream of the expansion section 24A. The cooling fins of the heat sinks 32, 34 and 36 are oriented in a direction of flow in the gas cooling duct 24. When there is a flow through the cooling fins, the compressed air which is cooled by the expansion cools the cooling fins of the heat sinks 30, 32 and 34. The heat sinks 30, 32 and 34 are connected in a thermally conductive fashion to corresponding power components 36, 38 and 40.

The power components 36, 38 and 40 are arranged outside the gas cooling duct 24. This is indicated in FIG. 2 by the contours of the power components 36, 38 and 40 which are illustrated only by dots. The power components 36, 38 and 40 can heat up during operation of the electronic control unit 20. The conduction away of heat from the power components 36, 38 and 40 takes place via the heat sinks 30, 32 and 34.

The power components 36, 38 and 40 are, in particular those components of the electronic control unit 20 which can heat up during the operation of the electronic control unit 20 to such an extent that they require cooling. The power components 36, 38 and 40 can be embodied, for example, as a processor, graphic processor, microcontroller, network interface and/or memory unit.

In some embodiments, a greater or smaller number of power components can be connected in a thermally conductive fashion to the gas cooling duct 24.

FIG. 3 shows by way of example how the power components 36, 38 and 40 are connected in a thermally conductive fashion to the heat sinks 30, 32 and 34. In the illustrated embodiment, the gas cooling duct 24 is fitted with the expansion section 24A onto the power components 36, 38 and 40.

An equipped circuit board 42 has a printed circuit board 44 and the power components 36, 38 and 40. The equipped circuit board 42 is arranged in such a way that the power components 36, 38 and 40 extend from the printed circuit board 44 in the direction of the gas cooling duct 24. In other words the printed circuit board 44 is equipped with the power components 36, 38 and 40 on a side which faces the gas cooling duct 24. Cooling of the heat sinks 30, 32 and 34 by means of the expanding compressed air therefore brings about cooling of the power components 36, 38 and 40.

The gas cooling duct 24 separates the compressed air from the equipped circuit board 42. It is therefore possible to prevent the equipped circuit board 42 from entering into contact with impurities in the compressed air such as, for example, particles of dust or oil droplets.

The power components 36, 38 and 40 are connected, in particular in a thermally conductive fashion, to the expansion section 24A or to a section of the gas cooling duct 24 downstream of the expansion section 24A. This permits the cooling performance by means of the expanding compressed air to be generated precisely where it is needed to cool the power components 36, 38 and 40.

The air which is heated by the heat sinks 30, 32, 34 exits the electronic control unit, for example without increased pressure, through the outlet 28. It goes without saying that not only are the power components 36, 38 and 40 cooled but also the entire equipped circuit board 42, by the cooling gas cooling duct 24.

The electronic control unit 20 can additionally have a temperature sensor 46. The temperature sensor 46 measures a temperature of the electronic control unit 20, in particular of the equipped circuit board 42 and/or of the power components 36, 38 and 40. On the basis of a temperature measurement by the temperature sensor 46, the electronic control unit 20 can control the gas valve 18 (see FIG. 1). For example, the electronic control unit 20 can control the gas valve 18 in such a way that a temperature between 20° C. and 40° C. as measured by the temperature sensor 46 remains. In particular, the gas valve 18 can be opened if the temperature of the electronic control unit 20 exceeds an upper threshold value. The gas valve 18 can be closed if the temperature of the electronic control unit 20 undershoots a lower threshold value. In some embodiments, a flow rate can additionally or alternatively be set by the gas valve 18 in a stepless fashion. It is also possible for a plurality of temperature sensors to be provided.

The conduction of heat between the heat sinks 30, 32 and 34 and the power components 36, 38 and 40 can be improved further by using thermally conducive paste, thermally conductive foils and/or additional heat sinks. In addition, heat sinks can be used, in particular, to bridge a distance between the power components 36, 38 and 40 and the gas cooling duct 24. In this way, it is possible, for example, to compensate for different heights of the power components 36, 38 and 40.

The selected cooling of the electronic control unit 20 permits the electronic control unit 20 to be operated in a cool operating range. Therefore, for example relatively high performance levels and a relatively long service life can be achieved. Furthermore, the proposed cooling system does not require any moving parts such as, for example, fans which can experience wear over time. In addition, the electronic control unit 20 can be embodied in a particularly compact way since no large surfaces are required for cooling by convection. If the electronic control unit 20 is arranged in a driver's cab of a motor vehicle, desired heating of the driver's cab can be reduced or prevented.

Figure 4:
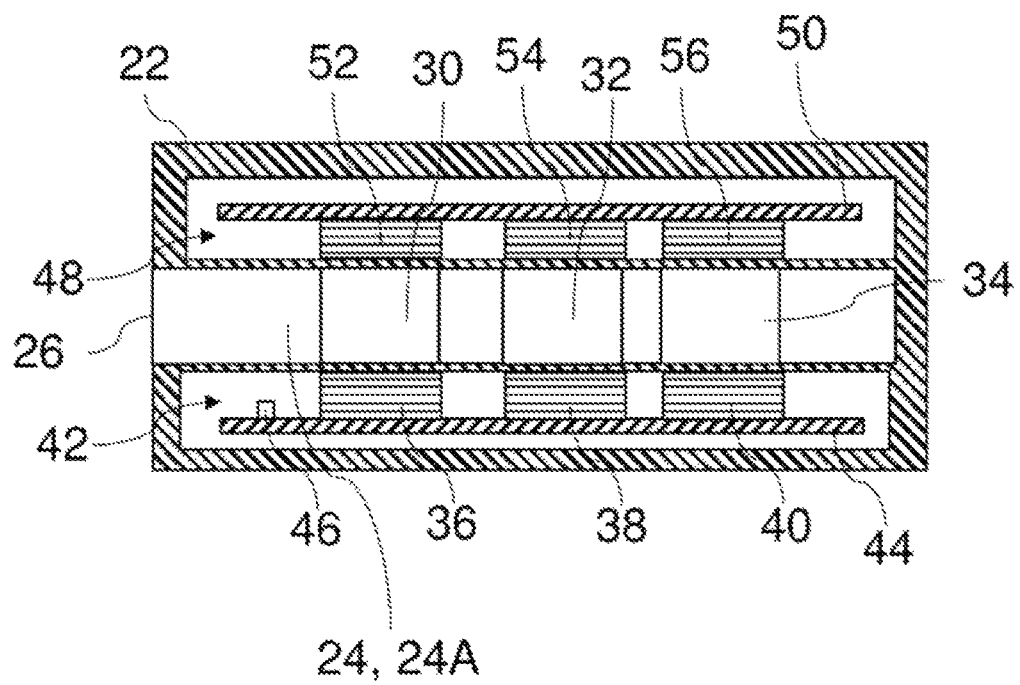
FIG. 4 shows a sectional illustration according to FIG. 3 of a different exemplary control unit.

FIG. 4 shows a further embodiment with two equipped circuit boards. In addition to the first equipped circuit board 42 as in the embodiment described previously, a second equipped circuit board 48 is provided. In particular, the gas cooling duct 24 is fitted onto the first equipped circuit board 42, and the second equipped circuit board 48 is fitted onto the gas cooling duct 24. The first equipped circuit board 42 and the second equipped circuit board 48 can be connected to one another.

The second equipped circuit board 48 has a printed circuit board 50 and power components 52, 54 and 56. The power components 52, 54 and 56 extend from the printed circuit board 50 in the direction of the gas cooling duct 24. The power components 52, 54 and 56 are connected in a thermally conductive fashion to the heat sinks 30, 32 and 34.

The illustrated sandwich design permits a particularly compact electronic control unit 22, since both an upper side and an underside of the gas cooling duct 24 are used for cooling.

In other embodiments, instead of the equipped circuit board 42 and/or the equipped circuit board 48 another electronic control device can be provided which is cooled by the expanding compressed air.

In some exemplary embodiments, the gas cooling duct 24 can be integrated into a cooling plate or cooling coil which is mounted together with the first electronic control device 42, the second electronic control device 48 (if present) and/or the housing 22 of the electronic control unit 20. It is therefore possible, for example, for a cooling plate or cooling coil to be fitted or mounted with the gas duct 24 directly onto the first electronic control device 42. The cooling plate or cooling coil can also be provided outside a housing of the first electronic control device 42.

Specialists will recognize that the device disclosed here for cooling the electronic control unit 20 is based on an innovative method for cooling an electronic control unit 20. The method can use, for example, the arrangement 10, and is accordingly described by way of example below.

The method for cooling the first and/or second equipped circuit boards 42, 48 comprises feeding a compressed gas, in particular compressed air, into the housing 22. In the housing 22 a defined expansion of the compressed gas takes place in the expansion section 24A. The expansion section 24A is connected in a thermally conductive fashion to the first and/or second equipped circuit boards 42, 48. The gas cools through the expansion. As a result, the first and/or the second equipped circuit boards 42, 48 are cooled.

Before the feeding of the compressed gas, the gas can be compressed, for example, by the compressor 14 (see FIG. 1). In this context, a temperature of the gas can be increased. The compressed gas can cool in the pressure tank 16 before it is fed into the housing 22 of the electronic control unit 20.

The present disclosure is not limited to the embodiments described above. In particular, a multiplicity of variants and refinements are possible which also make use of the concepts and therefore come under the scope of protection.

LIST OF REFERENCE SYMBOLS

10 Arrangement for cooling
12 Motor
14 Compressor
16 Pressure tank
18 Gas valve
20 Electronic control unit
22 Housing
24 Gas cooling duct
24A Expansion section
26 Inlet
28 Outlet
30 Heat sink
32 Heat sink
34 Heat sink
36 Power component
38 Power component
40 Power component
42 First equipped circuit board (first electronic control device)
44 Printed circuit board
46 Temperature sensor
48 Second equipped circuit board (second electronic control device)
50 Printed circuit board
52 Power component
54 Power component
56 Power component
X, Y, Z Direction of air flow

We claim:

1. An electronic control unit for a motor vehicle, comprising:
    a first electronic control device;
    a gas cooling duct for conducting a compressed gas, wherein the gas cooling duct:
        is connected in a thermally conductive fashion to the first electronic control device,
        is designed to separate the compressed gas from the first electronic control device, and
        has an expansion section in which a flow cross section of the gas cooling duct widens in order to expand and cool the compressed gas in order to cool the first electronic control device; and
    a heat sink arranged in the gas cooling duct and connected in a thermally conductive fashion to the first electronic control device,
    wherein the heat sink has a multiplicity of cooling fins, wherein the multiplicity of cooling fins are oriented in a direction of flow in the gas cooling duct.

2. The electronic control unit according to claim 1, further comprising a second electronic control device, wherein the gas cooling duct is arranged between the first electronic control device and the second electronic control device.

3. The electronic control unit according to claim 2, further comprising a housing, wherein the first electronic control device, the second electronic control device or the gas cooling duct is arranged in the housing.

4. The electronic control unit according to claim 2, wherein the first electronic control device or the second electronic control device has a power component, that is a processor, a graphic processor, a network interface, a microcontroller and/or a memory unit, wherein the power component is connected in a thermally conductive fashion to the gas cooling duct.

5. The electronic control unit according to claim 4, wherein the power component is connected in a thermally conductive fashion to the expansion section or a section downstream of the expansion section.

6. The electronic control unit according to claim 2, wherein the gas cooling duct is fitted onto the first electronic device, or the second electronic control device is fitted onto the gas cooling duct.

7. The electronic control unit according to claim 2, wherein the heat sink is connected in a thermally conductive fashion to the second electronic control device.

8. The electronic control unit according to claim 7, wherein the heat sink is arranged in the expansion section or in a section downstream of the expansion section.

9. The electronic control unit according to claim 7, wherein the heat sink is connected in a thermally conductive fashion to a power component of the first electronic control device or of the second electronic control device.

10. The electronic control unit according to claim 2, wherein the heat sink includes a multiplicity of heat sinks, which are provided for the first electronic control device or for the second electronic control device.

11. The electronic control unit according to claim 10, wherein the multiplicity of heat sinks are provided for a multiplicity of power components of the first electronic control device or of the second electronic control device.

12. The electronic control unit according to claim 2, wherein the gas cooling duct is integrated into a cooling plate or cooling coil which is mounted together with the first electronic control device, the second electronic control device or a housing of the electronic control unit.

13. The electronic control unit according to claim 2, wherein the first electronic control device or the second electronic control device includes a printed circuit board, and wherein the printed circuit board is equipped with a power component on a side which faces the gas cooling duct.

14. The electronic control unit according to claim 1, wherein the gas cooling duct is designed to conduct a compressed air or is or can be connected to a pressure tank.

15. The electronic control unit according to claim 14, further comprising a temperature sensor for measuring a temperature of a power component of the first electronic control device, of a second electronic control device or of the electronic control unit, wherein a gas valve is controlled on the basis of a temperature which is measured by the temperature sensor.

16. The electronic control unit according to claim 14, wherein the pressure tank is a compressed air tank.

17. The electronic control unit according to claim 1, further comprising a gas valve which is arranged in the gas cooling duct for setting a flow rate of the compressed gas.

18. The electronic control unit according to claim 17, wherein the gas valve is arranged upstream of the expansion section or upstream of the gas cooling duct.

19. A motor vehicle comprising:
a pressure tank;
an electronic control unit including a first electronic control device;
a gas cooling duct for conducting a compressed gas, wherein the gas cooling duct is:
connected in a thermally conductive fashion to the first electronic control device,
designed to separate the compressed gas from the first electronic control device, and
has an expansion section in which a flow cross section of the gas cooling duct widens in order to expand and cool the compressed gas in order to cool the first electronic control device, wherein the gas cooling duct of the electronic control unit is connected to the pressure tank, and wherein the motor vehicle includes a motor and a compressor which is driven by the motor and is connected to the pressure tank; and
a heat sink arranged in the gas cooling duct and connected in a thermally conductive fashion to the first electronic control device,
wherein the heat sink has a multiplicity of cooling fins, wherein the multiplicity of cooling fins are oriented in a direction of flow in the gas cooling duct.

\* \* \* \* \*